United States Patent
Kinoshita et al.

(10) Patent No.: US 7,578,679 B2
(45) Date of Patent: Aug. 25, 2009

(54) ELECTRIC CONNECTION BOX

(75) Inventors: Kousuke Kinoshita, Kosai (JP); Tetsuro Saimoto, Kosai (JP)

(73) Assignee: Yazaki Corporation, Tokyo (JP)

( * ) Notice: Subject to any disclaimer, the term of this patent is extended or adjusted under 35 U.S.C. 154(b) by 32 days.

(21) Appl. No.: 11/711,101

(22) Filed: Feb. 27, 2007

(65) Prior Publication Data

US 2007/0207639 A1 Sep. 6, 2007

(30) Foreign Application Priority Data

Feb. 27, 2006 (JP) .............................. 2006-050641

(51) Int. Cl.
*H05K 5/00* (2006.01)
(52) U.S. Cl. ..................... 439/76.1; 361/752
(58) Field of Classification Search ............... 439/76.1, 439/79, 80; 361/736, 752
See application file for complete search history.

(56) References Cited

U.S. PATENT DOCUMENTS

| | | | | |
|---|---|---|---|---|
| 3,864,000 A | * | 2/1975 | Coller et al. | 439/246 |
| 4,505,035 A | * | 3/1985 | Burton et al. | 29/843 |
| 4,639,056 A | * | 1/1987 | Lindeman et al. | 439/61 |
| 4,687,267 A | * | 8/1987 | Header et al. | 439/62 |
| 4,710,132 A | * | 12/1987 | Glomb et al. | 439/79 |
| 4,723,196 A | * | 2/1988 | Hofmeister et al. | 361/759 |
| 5,060,113 A | * | 10/1991 | Jacobs | 361/721 |
| 5,105,095 A | * | 4/1992 | Rudy et al. | 307/17 |
| 5,472,349 A | * | 12/1995 | Dixon et al. | 439/79 |
| 5,584,709 A | * | 12/1996 | Kiat | 439/79 |
| 5,971,775 A | * | 10/1999 | Tor et al. | 439/79 |
| 6,984,133 B2 | * | 1/2006 | Naitou et al. | 439/76.2 |
| 7,095,615 B2 | * | 8/2006 | Nichols | 361/719 |
| 7,118,646 B2 | * | 10/2006 | Hunkeler | 156/293 |

FOREIGN PATENT DOCUMENTS

JP 2000-92659 A 3/2000

* cited by examiner

*Primary Examiner*—Neil Abrams
(74) *Attorney, Agent, or Firm*—Sughrue Mion, PLLC

(57) ABSTRACT

In an electric connection box 100, a soldering surface clearance 15 is formed at a lower side of a circuit board 10 for the purpose of protecting those portions of terminals 11a (of the relays 11) and terminals 3a (of a connector 3) which are soldered to a circuit formed on the circuit board 10. In this electric connection box 100, the connector 3 is disposed beside an end 10a of the circuit board 10, and the circuit board 10, the soldering surface clearance 15 and the relays 11 are disposed within the range of a height of the connector 3. In this electric connection box 100, a fixing bracket 4 is formed at an intermediate portion of a rear surface of the connector 3 in a direction of the height thereof, and is fixed to the circuit board 10. The rear surface of the connector 3 abuts against the end of the circuit board 10, and an upper surface cover 1 and a lower surface cover 2 abut respectively against upper and lower surfaces of the connector 3.

3 Claims, 4 Drawing Sheets

ELECTRIC CONNECTION BOX

BACKGROUND OF THE INVENTION

1. Field of the Invention

This invention relates to an electric connection box (i.e., an electric junction box), such for example as a relay box, a fuse box and a power supply box, mounted on a vehicle such as an automobile.

2. Description of the Related Art

Various electric connection boxes are mounted on an automobile, and among these, there is the type of electric connection box in which a connector is provided at an end portion of a circuit board, received within the electric connection box, in such a posture that a fitting surface of the connector for a mating connector is directed outwardly (see; for example, JP-A-2000-92659).

FIGS. 3 and 4 show such a conventional electric connection box. This electric connection box includes a flat plate-like upper surface cover 1, a flat plate-like lower surface cover 2, a circuit board 10 received in a generally horizontal posture within a space formed between the upper and lower surface covers 1 and 2, relays (electric parts) 11 mounted on an upper surface of the circuit board 10, connectors 3 mounted on the upper surface of the circuit board 10 at end portions thereof in such a manner that their fitting surfaces for their respective mating connectors are directed outwardly, and a soldering surface clearance 15 secured at the lower side of the circuit board 10 for the purpose of protecting those portions of terminals 11a (of the relays 11) and terminals 3a (of the connectors 3) soldered to a circuit (circuit patterns) formed on the circuit board 10. In this case, each connector 3 is fixed to the circuit board 10 by screw-fastening a fixing bracket 4, formed on and projecting from a lower end portion of a rear surface of the connector 3, to the circuit board 10.

In the above conventional electric connection box, each connector 3 is mounted on the upper surface of the circuit board 10 at the end portion thereof, and therefore only the relays 11 are disposed within the range of the height of the connector 3, and a height (thickness) dimension H1 of the electric connection box is determined by the height of the connector 3, the thickness of the circuit board 10, and the soldering surface clearance 15 at the lower side of the circuit board 10, and therefore it has been difficult to achieve a thin design. And besides, many dead spaces S exist at the lower sides of the connectors 3 and at the upper sides of the relays 11, and therefore a compact design has not been achieved.

Furthermore, the fixing bracket 4 for fixing the connector 3 to the circuit board 10 is provided at the lower end portion of the connector 3 in the direction of the height thereof as shown in FIG. 4, and therefore a force A, applied when fitting and disconnecting the mating connector (not shown) relative to the connector 3, can not be transmitted to the circuit board 10 in a well-balanced manner, and an unnecessary bending moment B is applied to the connector 3 and the circuit board 10, and as a result there have been fears that the soldered portions of the terminals 3a, the screw-fastened portion of the fixing bracket 4, etc., are damaged.

SUMMARY OF THE INVENTION

This invention has been made in view of the above circumstances, and an object of the invention is to provide an electric connection box in which its height can be reduced to achieve a compact design, and a force applied when fitting and disconnecting a connector can be transmitted to a circuit board without an undue strain.

The above object has been achieved by an electric connection box of the present invention having features recited in the following Paragraphs (1) to (3).

(1) An electric connection box comprising:
an upper surface cover;
a lower surface cover;
a circuit board received in a generally horizontal posture within a space formed between said upper and lower surface covers;
electric parts mounted on an upper surface of said circuit board; and
a connector located at an end portion of said circuit board such that a fitting surface for a mating connector is directed outwardly;
wherein a soldering surface clearance is secured at a lower side of said circuit board so as to protect portions of terminals of said electric parts and connector soldered to a circuit formed on said circuit board;
wherein said connector is disposed beside the end of said circuit board, and said circuit board, said soldering surface clearance formed at the lower side of said circuit board, and said electric parts are disposed within the range of a height of said connector, and a fixing bracket is formed at an intermediate portion of a rear surface of said connector in a direction of the height of said connector, and said fixing bracket is fixed to said circuit board.

(2) The electric connection box of the above Paragraph (1) is characterized in that the rear surface of the connector abuts against the end of the circuit board.

(3) The electric connection box of the above Paragraph (1) or Paragraph (2) is characterized in that the upper surface cover and the lower surface cover abut respectively against upper and lower surfaces of the connector.

In the electric connection box of the construction of the above Paragraph (1), the connector is disposed beside the end of the circuit board, and the circuit board, the soldering surface clearance formed at the lower side of the board, and the electric parts are disposed within the range of the height of the connector, and therefore the height of the electric connection box can be determined only by the height of the connector. And besides, in the electric connection box of the construction of the above Paragraph (1), dead spaces formed at the lower side of the connector and at the upper sides of the electric parts can be reduced, so that a compact design can be achieved. Furthermore, in the electric connection box of the construction of the above Paragraph (1), the fixing bracket is formed at the intermediate portion of the rear surface of the connector in the direction of the height thereof, and this fixing bracket is fixed to the circuit board. Therefore, an external force, applied when fitting and disconnecting the connector, can be transmitted in a well-balanced manner to the circuit board, so that the development of an undue force can be suppressed as much as possible, thereby enhancing the reliability.

In the electric connection box of the construction of the above Paragraph (2), the rear surface of the connector abuts against the end of the circuit board, and therefore the external force can be transmitted to the circuit board not only through the fixing bracket but also directly through the rear surface of the connector, so that the circuit board can positively receive the external force applied to the connector.

In the electric connection box of the construction of the above Paragraph (3), the upper surface cover and the lower surface cover abut respectively against the upper and lower surfaces of the connector, and therefore the connector is held between (or gripped by) the upper and lower surfaces covers, so that the connector can be more firmly supported. Furthermore, in the electric connection box of the construction of the above Paragraph (3), the height of the electric connection box can be reduced as much as possible, that is, to a dimension close to the height of the connector.

In the present invention, there can be provided the electric connection box in which its height can be reduced to achieve the compact design, and a force applied when fitting and disconnecting the connector can be transmitted to the circuit board without an undue strain.

The present invention has been briefly described above. Details of the invention will become more manifest upon reading the following Section "Best Mode for Carrying Out the Invention" with reference to the accompanying drawings.

DESCRIPTION OF THE PREFERRED EMBODIMENTS

A preferred embodiment of the present invention will now be described in detail with reference to FIGS. 1 and 2.

Figure 1:
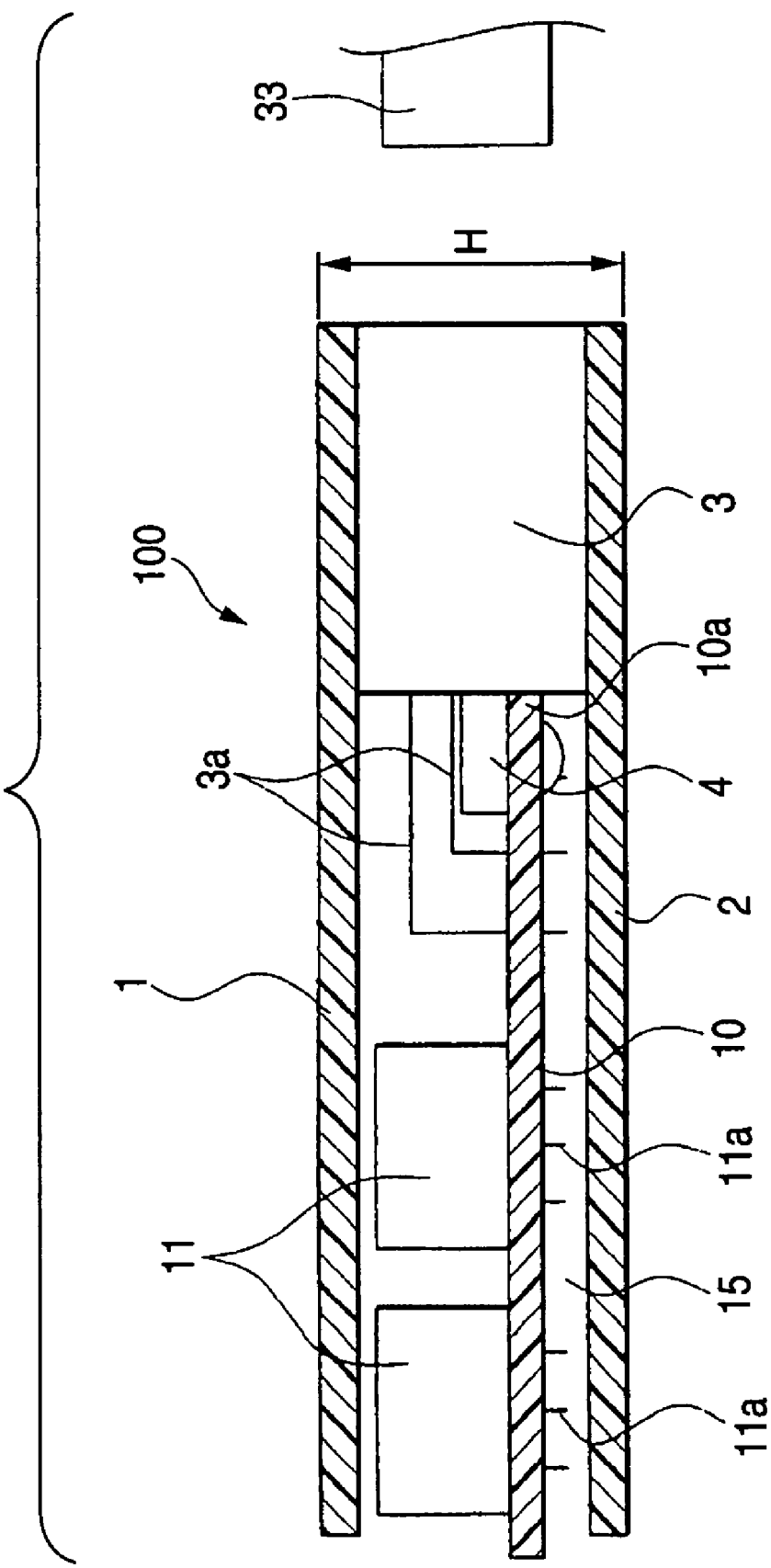
FIG. 1 is a cross-sectional view of a preferred embodiment of an electric connection box of the present invention.
Figure 2:
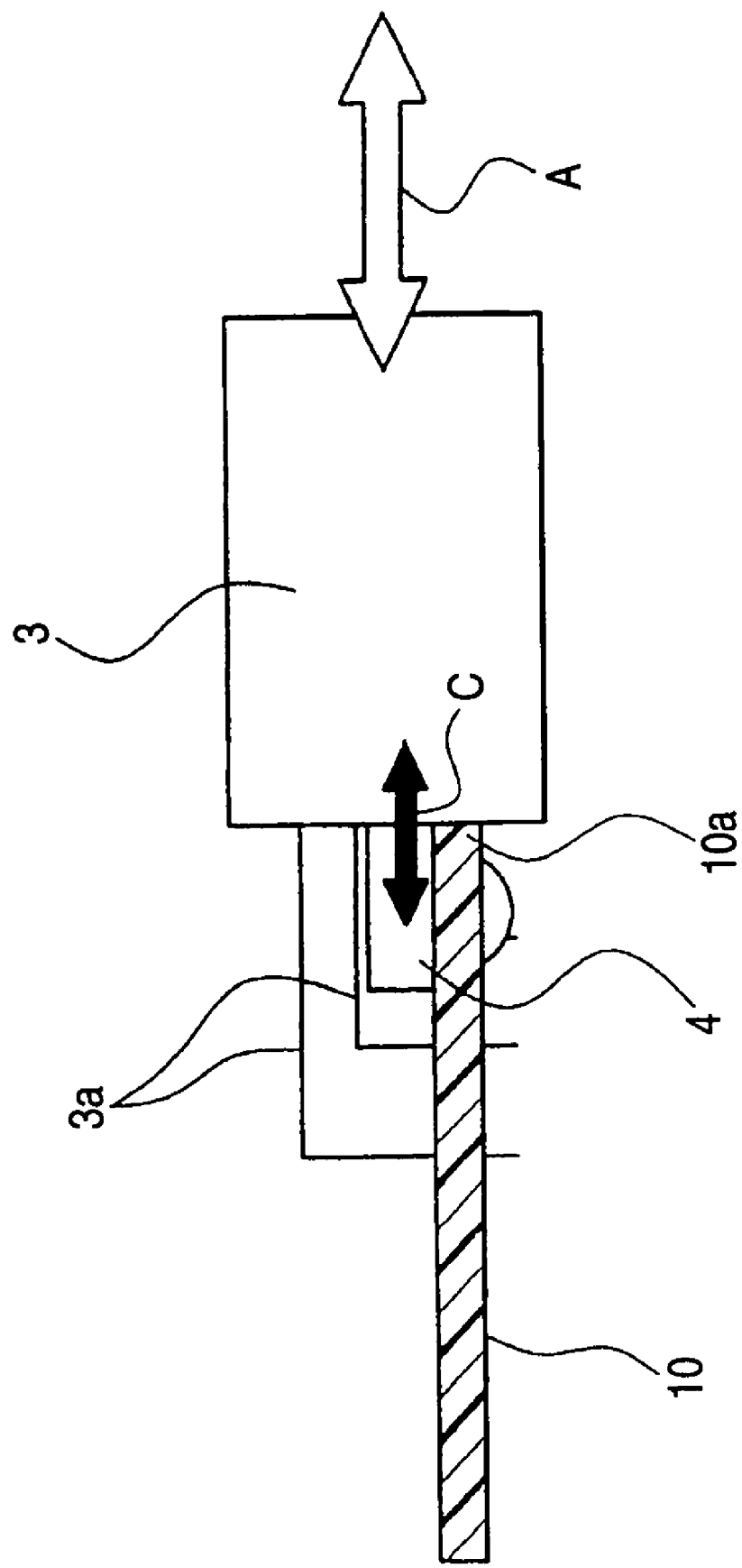
FIG. 2 is a view explanatory of directions in which a force, applied when fitting and disconnecting a connector, acts.

FIG. 1 is a cross-sectional view of one preferred embodiment of an electric connection box 100 of the invention.

Figure 3:
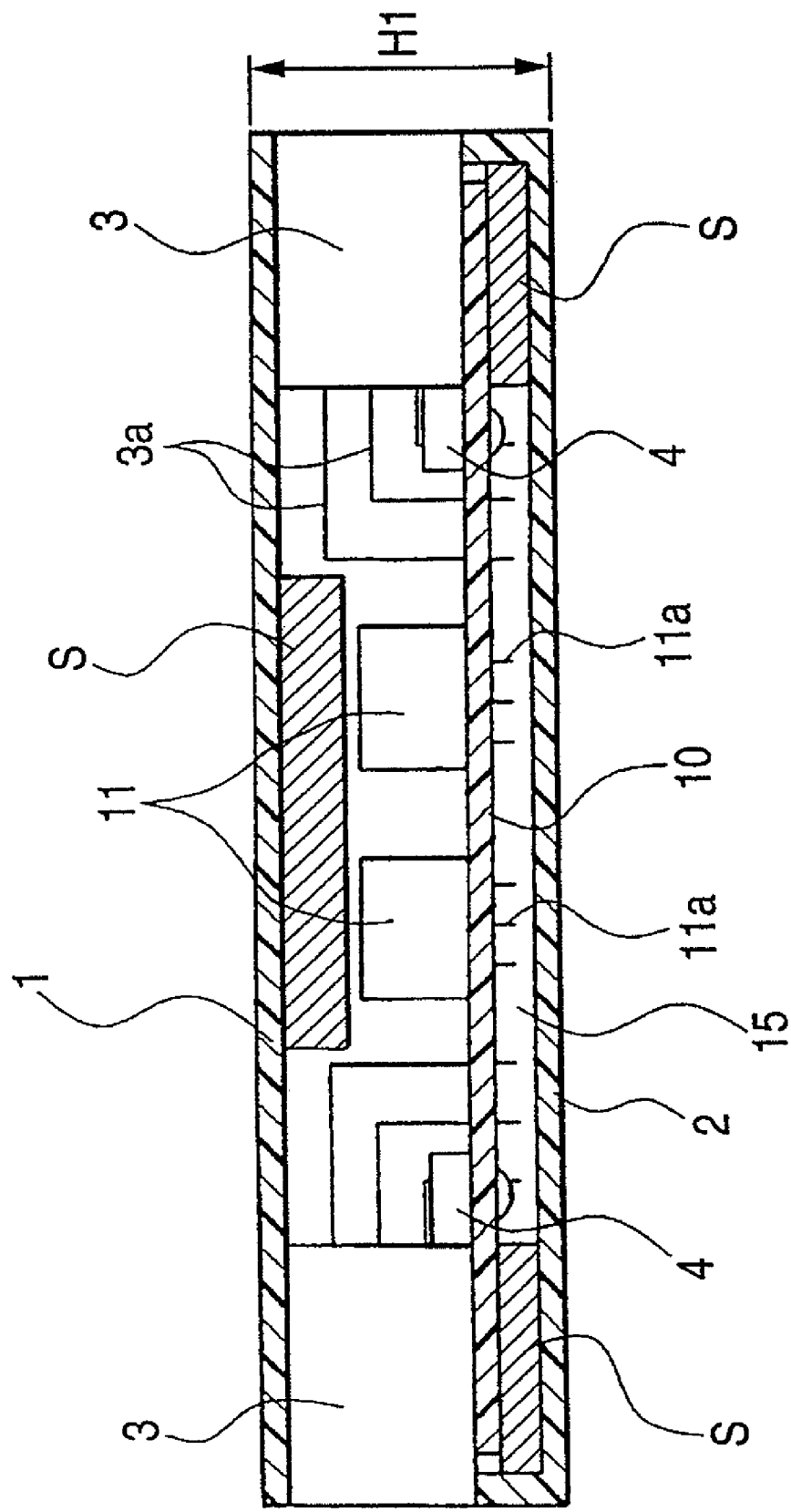
FIG. 3 is a cross-sectional view of a conventional electric connection box.
Figure 4:
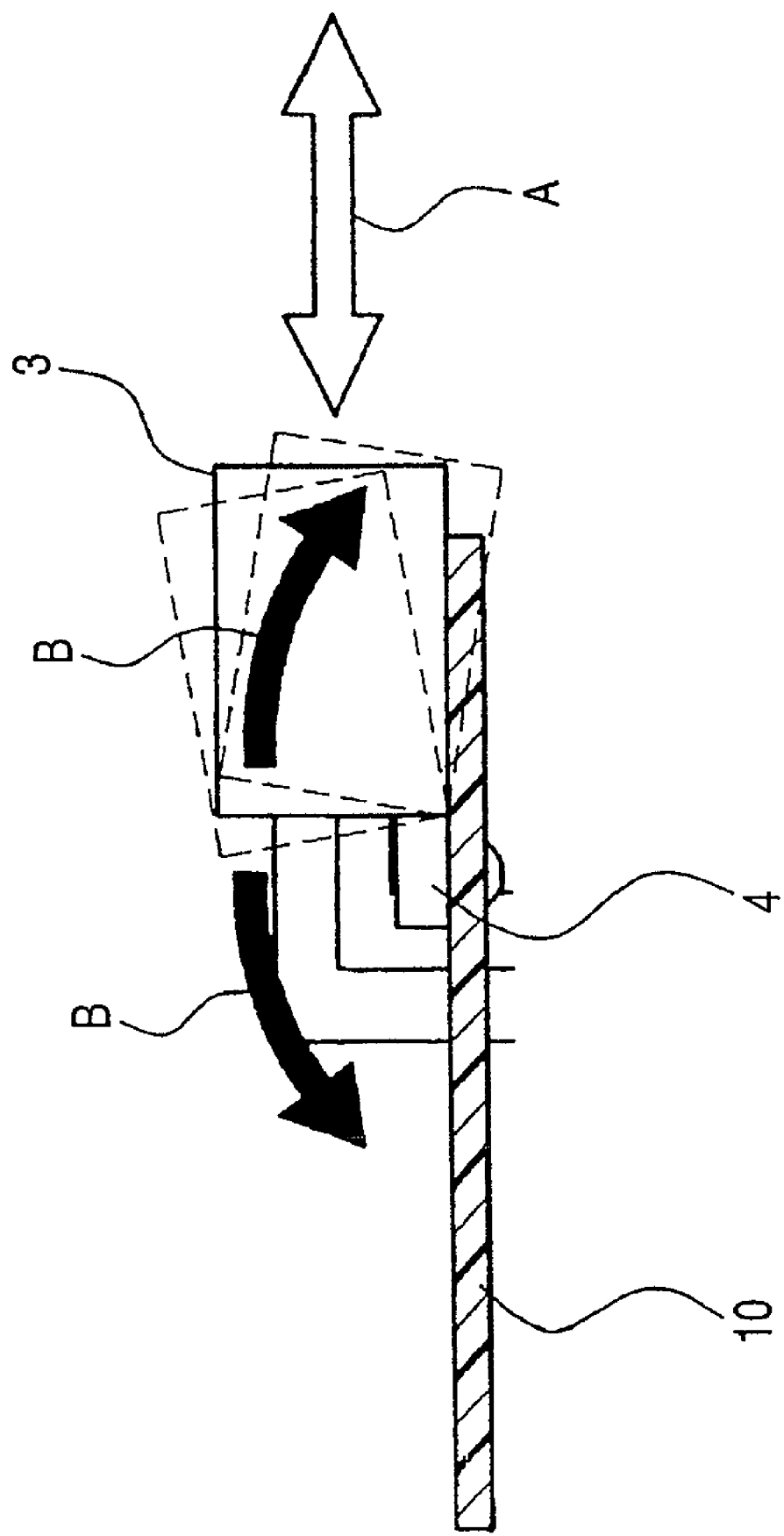
FIG. 4 is a view explanatory of directions in which a force, applied when fitting and disconnecting a connector, acts.

Like the electric connection box of FIG. 3, the electric connection box 100 of this embodiment comprises an upper surface cover 1, a lower surface cover 2, a circuit board 10 received in a generally horizontal posture within a space formed between the upper and lower surface covers 1 and 2, relays (electric parts) 11 mounted on an upper surface of the circuit board 10, and a connector 3 provided at an end of the circuit board 10 in such a manner that its fitting surface for a mating connector 33 is directed outwardly. The electric connection box 100 has a soldering surface clearance 15 secured at the lower side of the circuit board 10 for the purpose of protecting those portions of terminals 11a (of the relays 11) and terminals 3a (of the connector 3) which are soldered to a circuit (circuit patterns) formed on the circuit board 10.

Referring to features of the invention, the connector 3 is disposed beside the end 10a of the circuit board 10, and the circuit board 10, the soldering surface clearance 15 formed at the lower side of the circuit board 10, and the relays 11 are disposed within the range of a height of the connector 3. Further, a fixing bracket 4 is formed at an intermediate portion of a rear surface of the connector 3 in the direction of the height of this connector 3, and this fixing bracket 4 is screw-fastened to the circuit board 10. Furthermore, the rear surface of the connector 3 abuts against the end (or edge) 10a of the circuit board 10, and the upper surface cover 1 and the lower surface cover 2 abut respectively against upper and lower surfaces of the connector 3.

Thus, the connector 3 is disposed beside the end 10a of the circuit board 10, and the circuit board 10, the soldering surface clearance 15 formed at the lower side of the board 10, and the relays 11 are disposed within the range of the height of the connector 3. With this arrangement, a height dimension H of the electric connection box 100 can be determined only by the height of the connector 3. Particularly, the upper surface cover 1 and the lower surface cover 2 abut respectively against the upper and lower surfaces of the connector 3, and therefore the height dimension H of the electric connection box 100 can be reduced as much as possible, that is, to a dimension close to the height of the connector 3. Also, dead spaces (see FIG. 3) formed at the lower side of the connector 3 and at the upper sides of the relays 11 can be reduced, and therefore a compact design can be achieved.

Furthermore, the fixing bracket 4 is formed at the intermediate portion of the rear surface of the connector 3 in the direction of the height thereof, and this fixing bracket 4 is screw-fastened to the circuit board 10. Therefore, an external force A, applied when fitting and disconnecting the connector 3, can be transmitted in a well-balanced manner to the circuit board 10 as a force C exerted along a median plane of the circuit board 10 as shown in FIG. 2, so that the development of an undue force can be suppressed as much as possible, thereby enhancing the reliability.

Particularly, the rear surface of the connector 3 abuts against the end 10a of the circuit board 10, and therefore the external force A can be transmitted to the circuit board 10 not only through the fixing bracket 4 but also directly through the rear surface of the connector 3, so that the circuit board can positively receive the external force applied to the connector 3. And besides, the upper surface cover 1 and the lower surface cover 2 abut respectively against the upper and lower surfaces of the connector 3, and therefore the connector 3 is held between (or gripped by) the upper and lower surfaces covers 1 and 2, so that the connector 3 can be more firmly supported. Therefore, there can be provided the electric connection box 100 which has a high rigidity and the compact design.

The present invention is not limited to the above embodiment, and suitable modifications, improvements, combinations, etc., can be made. Furthermore, the material, shape, dimensions, numerical values, number, disposition, etc., of each of the constituent elements of the above embodiment are arbitrary, and are not limited in so far as the invention can be achieved.

What is claimed is:

1. An electric connection box comprising:
an upper surface cover;
a lower surface cover which forms a space between the upper and lower surface covers;
a circuit board received in a generally horizontal posture within the space;
an electric part mounted on an upper surface of said circuit board;
a connector which is located at an end portion of said circuit board, and has a fitting surface directed for a mating connector; and
a connecting terminal electrically connecting the connector to the circuit board,
wherein a soldering surface clearance is secured between said circuit board and said lower surface cover so as to protect portions of terminals of said electric part and the connection terminal soldered to a circuit formed on said circuit board, such that neither a body part of the electric part mounted on the upper surface of the circuit board nor body parts of other electric parts are disposed within the soldering surface clearance;
wherein said circuit board, said soldering surface clearance, and said electric part are disposed within the range of a height of the fitting surface of said connector, and
wherein a fixing bracket is formed at an intermediate portion of a surface opposed to the fitting surface of said connector in a direction of the height of the fitting surface of said connector, said fixing bracket is fixed to said circuit board, and said fixing bracket is electrically independent of the connecting terminal, wherein the height of the fitting surface of the connector is substantially equal to the distance between the upper and lower surface cover.

2. The electric connection box according to claim 1, wherein the surface of said connector opposed to the fitting surface abuts against the end of said circuit board.

3. The electric connection box according to claim 1, wherein said upper surface cover and said lower surface cover abut respectively against upper and lower surfaces of said connector.

* * * * *